(12) United States Patent
Tarpara et al.

(10) Patent No.: US 10,075,164 B2
(45) Date of Patent: Sep. 11, 2018

(54) CAPACITIVE AND CONDUCTIVE SENSING ILLUMINATING CABLE

(71) Applicant: Shrey Jagdish Tarpara, Boyds, MD (US)

(72) Inventors: Shrey Jagdish Tarpara, Boyds, MD (US); Ian Grissom, Columbia, MD (US); Micaela Larson, Germantown, MD (US)

(73) Assignee: Shrey Jagdish Tarpara, Boyds, MD (US)

( * ) Notice: Subject to any disclaimer, the term of this patent is extended or adjusted under 35 U.S.C. 154(b) by 0 days.

(21) Appl. No.: 14/752,943

(22) Filed: Jun. 28, 2015

(65) Prior Publication Data

US 2016/0071380 A1 Mar. 10, 2016

Related U.S. Application Data

(60) Provisional application No. 62/020,820, filed on Jul. 3, 2014.

(51) Int. Cl.
*H01R 13/717* (2006.01)
*H03K 17/975* (2006.01)
*H03K 17/96* (2006.01)

(52) U.S. Cl.
CPC ......... *H03K 17/975* (2013.01); *H03K 17/962* (2013.01); *H03K 2017/9602* (2013.01)

(58) Field of Classification Search
CPC .............. H01R 13/6683; H01R 13/717; H01R 13/7175
USPC ............................... 340/562, 545.4, 614, 626
See application file for complete search history.

(56) References Cited

U.S. PATENT DOCUMENTS

| | | | |
|---|---|---|---|
| 2009/0260897 A1* | 10/2009 | Kruse | G06F 3/044 178/18.01 |
| 2011/0128254 A1* | 6/2011 | Teranishi | G06F 3/0412 345/174 |
| 2014/0112005 A1* | 4/2014 | Chen | H01R 13/6683 362/382 |

* cited by examiner

*Primary Examiner* — Kevin Kim

(57) ABSTRACT

This invention is the design for a sensing circuit. The above detailed description defines the two main sensing techniques: Capacitive and Conductive sensing. The sensors used can be placed along the surface or under the surface, which in many cases will be a wire or cable in as many places as desired by the user or manufacturer. Once a sensor is turned on, it will complete the circuit and allow for electricity to flow to the illuminating, or communicating part of the invention. This will allow users to see the cable's path and direction allowing for easier troubleshoot and maintenance.

12 Claims, 8 Drawing Sheets

Figure 1: Sample MCU Housing

Figure 2: Housing for MCU Integrated with Wire

Figure 3: Inter-Locking Links

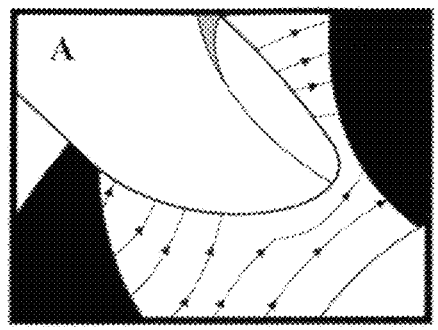

Figure 5A

Figure 5A: The small arrows on the wire that is being touched represent the capacitance that is flowing along the wire. This capacitance can be changed by any capacitive stylus that will change the recorded capacitance a certain amount. How much the capacitance has to change in order for the light-emitting sources to turn on can vary depending on the particular application and the users needs.

Figure 5B: The MCU constantly records the capacitance and when it is given a signal that the capacitance has changed past the desired limit, it will send a signal to the transistor.

Figure 5C: The transistor obtains the signal from the MCU, and then sends a signal to the battery causing the battery to give more power to the light sources.

Figure 5D: The Battery powers the light sources until the MCU detects that the capacitance has gone back to the original setting.

CAPACITIVE AND CONDUCTIVE SENSING ILLUMINATING CABLE

CROSS REFERENCE TO RELATED APPLICATIONS

This document is the Nonprovisional application relating to Provisional Application No. 62/020,820 titled Capacitive and Conductive Sensing Illuminating Cable. This patent was filed on Jul. 3, 2014. The EFS ID is 19494965.

STATEMENT REGARDING FEDERALLY SPONSORED RESEARCH OF DEVELOPMENT

This invention was not sponsored by the government or any federal institution for research or development.

THE NAMES OF THE PARTIES TO A JOINT RESEARCH AGREEMENT

There were no joint research agreements signed in the development of this invention with any group.

STATEMENT REGARDING PRIOR DISCLOSURES BY THE INVENTOR OR A JOINT INVENTOR

There were no prior disclosures of this invention by an inventor or joint inventor

BACKGROUND OF THE INVENTION

Typically, in spaces that house a plethora of cables and electronics, it becomes difficult to distinguish between cables. Current solutions use color-coding or labeling as a method to differentiate these. However, many times the cables are located in dimly-lit locations and thus make it hard to determine colors or read labels when trying to replace or repair connections, or troubleshoot issues. This invention uses different sensing techniques to illuminate cables completely or at selected locations across their length.

The present invention is regarding a system and method of lighting an electronic device, such as a cable wire, when a human body or a stylus either comes in proximity of or in contact with the device using capacitive sensing, resistive sensing, or a combination thereof.

BRIEF DESCRIPTION OF THE SEVERAL VIEWS OF THE DRAWINGS

FIG. 5

FIG. 5A: The small arrows on the wire that is being touched represent the capacitance that is flowing along the wire. This capacitance can be changed by any capacitive stylus that will change the recorded capacitance a certain amount. How much the capacitance has to change in order for the light-emitting sources to turn on can vary depending on the particular application and the users needs.

DETAILED DESCRIPTION OF THE INVENTION

Figure 1:
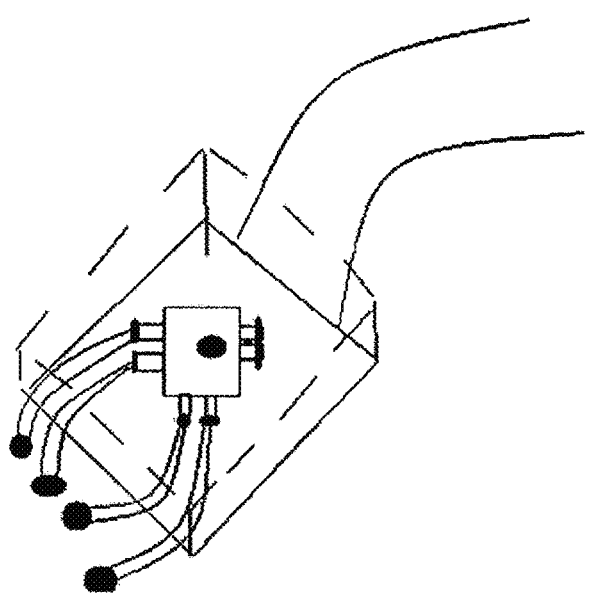
FIG. 1 shows a sample housing technique for the MCU unit. This MCU can be placed at any point along the cable. However, the MCU must be able to connect to the power source as well as sensors.
Figure 2:
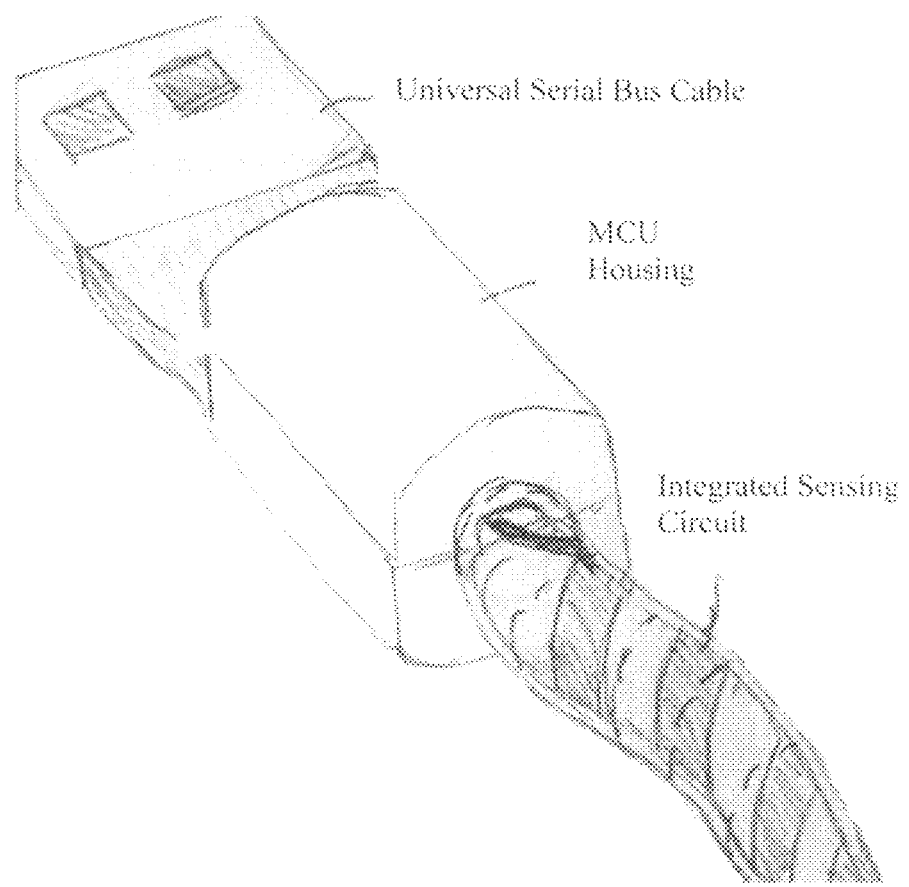
In FIG. 2, depicts a possible location for placing the MCU housing. In this embodiment it is connected directly to the end of a Universal Serial Bus (USB) cable and is integrated directly to the sensing circuit.

This invention relates to the application of an illuminating technology at certain points and/or completely along the length of a surface, such as a cable. In order to activate the illumination, a sensing technique is necessary.

This invention provides a cable sensing device comprising:
a central flexible shaft;
at least one capacitor disposed on an outer surface of the flexible shaft, the at least one capacitor comprising a first capacitive sensor, a second capacitive sensor and a dielectric element disposed between the first capacitive sensor and the second capacitive sensor; and
a plurality of lighting sources;
wherein a change in capacitance detected by a microcontroller when a human body comes in proximity of or in contact with the at least one capacitor causes at least one of the plurality of lighting sources to be illuminated if the detected change in capacitance is above a predetermined level;
the dielectric element may be foam;
the first capacitive sensor may be disposed on an outer layer of the cable sensing device and the second capacitive sensor may be disposed on an inner layer of the cable sensing device;
the outer layer and the inner layer may be substantially cylindrical in shape;
the at least one capacitor and the plurality of lighting sources may be disposed along the length of the cable sensing device;
the at least one capacitor and the plurality of lighting sources may be disposed along the circumference of the cable sensing device;
the at least one capacitor and the plurality of lighting sources may be disposed spirally along the length of the cable sensing device;
the outermost layer may comprise a rigid series of interlocking pieces;
the plurality of lighting sources may be one of a LED, a quantum dot LED (QDLED) or an organic LED (OLED).

The present invention provides a method of sensing, comprising of the following:
charging at least one capacitor disposed on an outer surface of a central flexible shaft;

detecting, by a microcontroller, a change in capacitance when a human body comes close or in contact with the at least one capacitor;
sending, by a microcontroller, a power signal to at least one or a plurality of lighting sources when the detected change in capacitance is above a predetermined level; and
illuminating at least one of the pluralities of lighting sources when the power signal is received.

The present invention provides a cable sensing device comprising:
at least one pair of conductive sensors, the at least one pair of conductive sensors comprising a first conductive sensor and a second conductive sensor disposed on opposite sides of a circumference of the cable sensing device, wherein the first conductive sensor is configured to receive a low voltage stock; and
a plurality of lighting sources;
wherein a change in resistance detected by a microcontroller when a human body comes in contact with the cable sensing device causes at least one of the pluralities of lighting sources to be illuminated if the detected change in resistance is above a predetermined level;
The microcontroller may comprise multiple comparator circuits;
The first conductive sensor and the second conductive sensor may be conductive foams.

The present invention provides a cable sensing device comprising:
a central flexible shaft;
at least one capacitor disposed on an outer surface of the flexible shaft, the at least one capacitor comprising a first capacitive sensor, a second capacitive sensor and a dielectric element disposed between the first capacitive sensor and the second capacitive sensor;
a plurality of lighting sources; and
a microcontroller configured to detect a change in capacitance when a human body comes close or in contact with the at least one capacitor and send a power signal to illuminate at least one of the plurality of lighting sources if the detected change in capacitance is above a predetermined level.

The present invention provides a cable sensing device comprising:
at least one pair of conductive sensors, the at least one pair of conductive sensors comprising a first conductive sensor and a second conductive sensor disposed on opposite sides of a circumference of the cable sensing device;
a plurality of lighting sources; and
a microcontroller configured to supply a low stock voltage to the first conductive sensor, detect a change in resistance of the at least one pair of conductive sensors when a human body comes in contact with the cable sensing device and send a power signal to illuminate at least one of the plurality of lighting sources if the detected change in resistance is above a predetermined level.

The present invention provides a method of sensing comprising:
supplying, by a microcontroller, a low stock voltage to at least one pair of conductive sensors,
the at least one pair of conductive sensors comprising a first conductive sensor and a second conductive sensor disposed on opposite sides of a circumference of a flexible cable;
detecting, by a microcontroller, a change in resistance when a human body comes in contact with the flexible cable;
sending, by a microcontroller, a power signal to at least one of a plurality of lighting sources when the detected change in resistance is above a predetermined level; and
illuminating at least one of the pluralities of lighting sources when the power signal is received.

One example includes the placement of capacitive sensors at certain points or along the entire length of a cable wire to detect a change in capacitance when a human hand either comes in the proximity of, or in contact with the cable wire. A detected change in capacitance above a predetermined threshold triggers a microcontroller to send a signal to the LEDs placed inside the cable wire, thereby illuminating the LEDs.

Another example includes the placement of pairs of conductive sensors at certain points, or along the entire length of a cable wire, to detect a change in resistance when a human hand comes in contact with the cable wire. A detected change in resistance above a predetermined threshold triggers a microcontroller to send a signal to the LEDs placed inside the cable wire, thereby illuminating the LEDs.

Capacitive Sensing

A makeshift capacitor may be formed in order to act as the cable's sensing device.

This technology may involve two conductive layers, a micro-processing unit (MCU) or microcontroller, and a light-emitting source. The conductive layers can be made of any conductive substance such as Aluminum, Nickel, Brass, or Copper. Once a change in capacitance is detected from the capacitive sensor by the MCU, the MCU can send the signal to the transistor to power the device at the other end, which in one embodiment can be LEDs.

These devices can be arranged in various configurations. Several examples are provided below.

Any configuration that creates an appropriate capacitor or capacitive arrangement may be used.

Embodiment 1

The capacitor may include two conductive sleeves, similar to the type of sleeves that are used to make metal shielding cables. The two sleeves may overlap such that one has a smaller diameter and will be placed inside the other. The two sleeves may be separated by a gap, such that one sleeve cannot contact the other. This forms a single capacitor.

Embodiment 2

The capacitors may include several strips of conductive material that span the length of the cable.

Each capacitor may be produced by placing two adjacent strips along the length of the cable such that they do not come into contact. These strips may not be spiraled. Several of the capacitors may be laid out such that the entire circumference of the cable is covered. These capacitors may be wired in parallel and the voltage discharge across all capacitors may be monitored such that a change in capacitance across one or more of the elements will result in a changed voltage discharge time across all elements and an illumination of the lighting system.

Embodiment 3

The capacitors may be formed by two strips of conductive material separated by a gap, spiraled down the length of the cable. This embodiment can be envisioned by a candy cane with two stripes. The area between the capacitors will be the area between two stripes.

Figure 4:
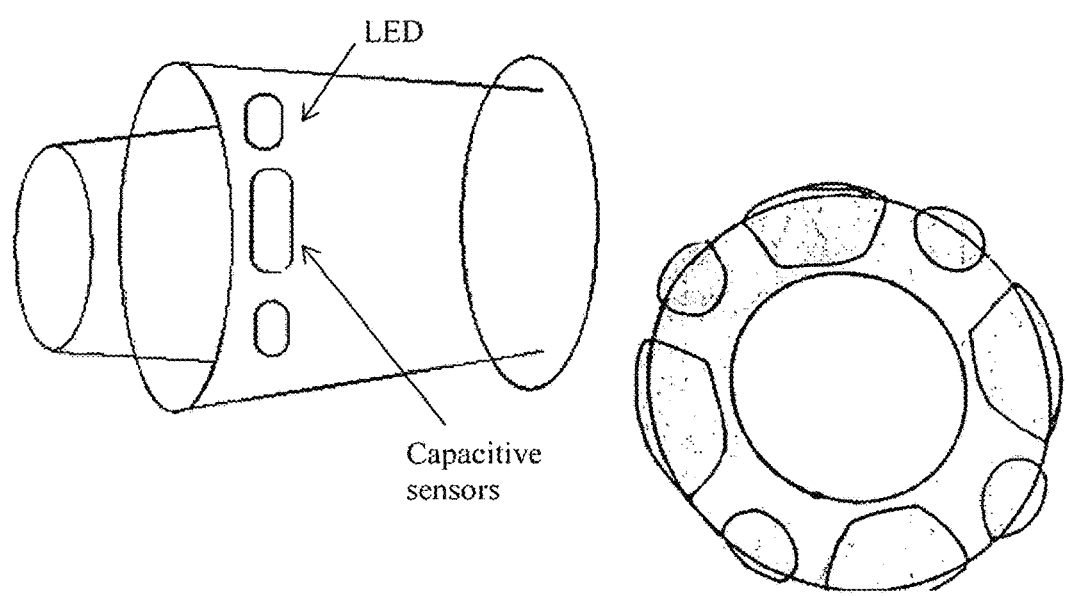

These three embodiments describe ways to create the capacitor. However, the location at which they are created can vary. The capacitors do not have to span the entire length of the cable. They can be created in certain locations, such as the ends of the cable. See FIG. 4 for details.

The gap between the two layers can be created by placing any material that is not conductive.

This material may be a foam, plastic, rubber or like thereof.

The capacitor may be charged and discharged through the use of a microcontroller. Examples of microcontrollers suitable for use with embodiments of the invention may contain the following specs:

1-4V supply voltage
Clock speed 23-25 MHz with 150 microA/MHz supply current
Sleep mode
Capacitive to Digital converter for capacitive sensing (resolution: 16 bits with 40 microsecond conversion time)

The number of clock cycles it takes for the capacitor to discharge may be tracked, for example, through the use of a variable stored in memory. The MCU should be capable of using a weighted average to account for environmental change around the cable as well as minor changes in the capacitance caused by bending of the cable.

When a human hand comes in proximity of or in contact with the cable, it will distort the electrical field of the capacitor and thus alter its capacitance. The change in capacitance creates a change in the discharge time. The change in a discharge time may be used to detect a positive trigger. Once the MCU detects this change in capacitance, it sends a signal to a transistor. This transistor will amplify the power going between the battery and the light-emitting source/sources. The placement of the transistor can be on the interior or exterior of the cable.

The following discusses placement possibilities for any of the previously stated embodiment, although, other placement configurations can also work.

Option 1

Figure 5B:
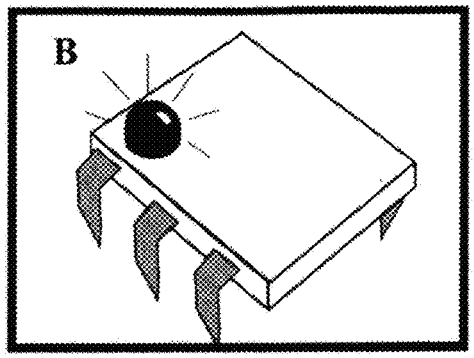
FIG. 5B: The MCU constantly records the capacitance and when it is given a signal that the capacitance has changed past the desired limit, it will send a signal to the transistor.
Figure 5C:
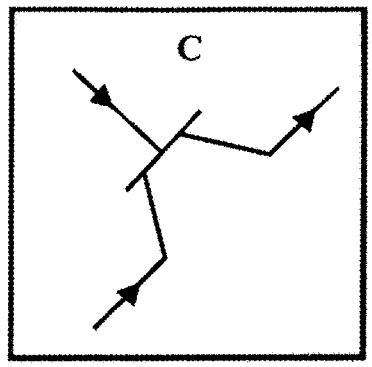
FIG. 5C: The transistor obtains the signal from the MCU, and then sends a signal to the battery causing the battery to give more power to the light sources.
Figure 5D:
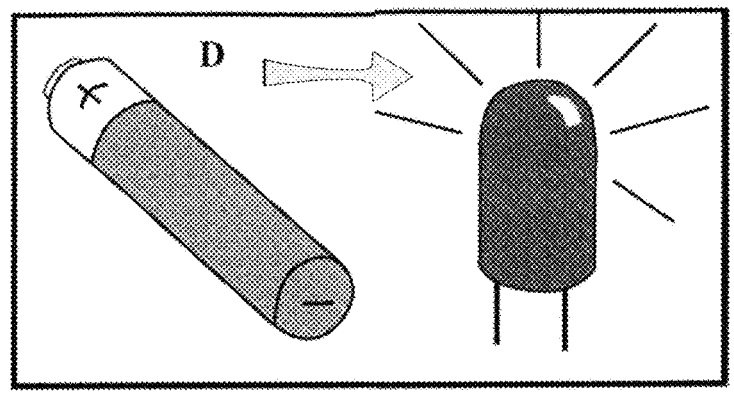
FIG. 5D: The Battery powers the light sources until the MCU detects that the capacitance has gone back to the original setting.

The capacitor may be laced onto the exterior of the cable. By doing so, the area between the two plates of the capacitor is exposed to direct contact. The human skin is made mostly of water and can distort the electric field between the two plates. See FIG. 5 for details.

Option 2

The plates of the capacitor can be placed into the interior of the cable such that the area between the two plates occupies a fraction of the cable width. By pressing on the cable, the area between the two plates is altered, altering the capacitance. The effect of the hand near the plates may also serve to change the capacitance in this configuration.

When a positive trigger does occur, the microcontroller may, for example, raise an output pin to high. This pin is connected to a transistor which is in the path between the power source and the illumination device/illuminating source. By raising and lowering the output pin, the illumination source can be triggered high and low.

Pressure Sensing

The sensor may include strips of conductive foam. Conductive foam has a built-in resistance that can be altered by applying pressure to it.

Embodiment 1

Strips are placed inside one of the layers of the cable, along its length. Strips may be laid out in pairs such that every strip has another strip located directly on the other side of the cable. A recommended minimum of six strips are necessary, with no spiraling. Each strip will be supplied a low stock voltage supply on one end. At the opposite end, each strip's current will be compared to the strip located directly on the other side of the cable. Changes brought about by pinching the cable will alter the resistance of the strip and thus the current as well. Strips are compared in this manner to account for natural bending of the cable. After each strip has been compared to its counterpart, the pairs will be compared to each other to determine a positive trigger.

Embodiment 2

Conductive foam may be placed inside the layers of the cable in ringlets, which are connected by a conducting element. This embodiment can be envisioned by placing several rings on a cylinder.

This allows for flexing of the cable with minimal compression of the ringlets, except due to directly inflicted pressure. A stock voltage will be supplied to the ringlet chain, and the current will be measured at the opposite end. A change in current above a predetermined threshold will serve as a positive trigger.

The changes in current will need to be monitored in order to determine whether or not to activate the illumination source. The discussion about the 2 options noted above for pressure sensing is provided below.

Option 1

A microcontroller may be used with multiple current comparator circuits. This option allows for some higher level computation and algorithms to determine a positive trigger. It also increases energy consumption. When a positive trigger is detected, as in the capacitive sensing circuit, an output pin wired to a transistor will be set to high.

Option 2

Basic current comparators, wired directly to a transistor, may be used. The comparator would compare the current coming from the conductive foam elements of the cable to a stock current of known value to determine if a positive trigger has been reached.

Similar to the capacitance sensors, the locations of the pressure sensors can vary. These sensors do not have to be placed along the entire length of the cable, and can be placed at certain locations, such as the cable ends. Although conductive foam is described here, other types of pressure sensing materials can also be used in order to sense when the pressure has changed.

Combinational Design

In some embodiments, both of these capacitive and pressure sensing may be used together. This will allow users to still see the entire path of the cable wire hut, if both sensors are triggered, such would be the case if the user is tugging at the cable or moving it around, then the MCU would not send a signal to the LEDs, and thus, the LEDs would not light up. This would be beneficial because if a user is replacing the cable, or simply putting it into a different spot, then he/she may not necessarily want the cable to illuminate.

Battery—Power Supply

A battery may be used within the cable to allow the cable to light up regardless of whether it is plugged in to another device or not. The battery can be placed on one end of the cable and connected to the circuit such that the transistor will send a signal directly to the battery so that it can then power the light-emitting source. The battery may be recharged when it is plugged in to certain devices.

Outer Casing

The outer casing may be a rigid series of interlocking pieces that allow flexibility—like a bending shower hose. The outer casing may also be a flexible woven surface, resembling a garden hose material or it may be one smooth flexible material such as the rubber which currently is standard for cables. The lighting and sensing system is held in place by the outer casing, allowing the lighting to be seen on the surface, with the wiring held underneath or within the outer casing. The sensing system may also be partly exposed on the surface of the outer casing, as long as it remains connected to power and housed within the outer casing.

The lighting system may be, but not limited to, a series of LEDs, QDLEDs, or OLEDs. The size may range from pico LED to 5 millimeter.

How LEDs Fit onto Each Layer

Each interlocking piece may have LEDs built into them, along with a capacitance or pressure sensor, depending on which of the above designs are chosen.

Figure 3:
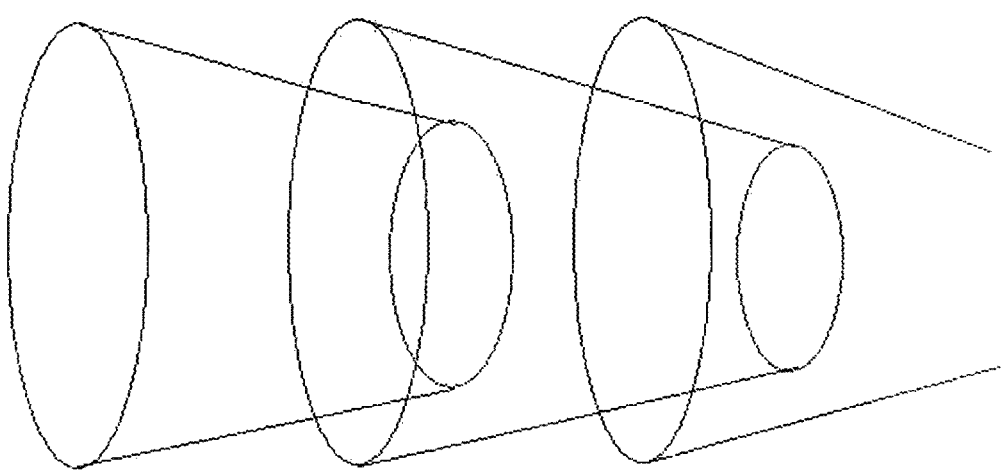
FIG. 3 shows a possible outer layer for the core. This will cover all sensors and allows for flexibility and rigidity of the cable. Although the outer layer is not necessary, it can protect sensors and allow for lighting. This particular example shows inter-locking links that are placed along the outside of the cable FIG. 4 Above, shows possible locations for capacitor sensors and LEDs. In one embodiment, the capacitive sensors are placed on opposite sides of the cable core and as a change in capacitance is detected, the LEDs will illuminate.

See FIG. 3 for details related to outer-casing.

The Core of the Cable

Embodiments of the invention described here may include a core used to communicate data, transmit fluids, maintain a structure for conducting electrical signals, or provide structural support.

For example, the core may be used as a universal serial bus port, a computer cable, a power cord for an electronic device, a fiber optic waveguide, medical tubing, or a variety of structural support cables. The core may be made of either flexible or rigid material; and, it may be either conductive or non-conductive. The diameter of the core may vary depending on its use. The core can have many different types of surfaces. If the type of surface of the core is conductive, it may be used as the first conductive layer. If it is not conductive, then there will be two conductive layers added on top of the core.

The core's cross-sectional shape typically may not matter as long as the sensors are cut in the proper way to make sure the sensors are not turned on by the way they are attached on to the core. The core can be as long or short as it has to, based on the type of data/power that is traveling through it and however long the cable user needs it to be.

In addition, the core may also include a composite of materials either bundled or assembled in a configuration that approximates the dimensions of a conduit or cable. For example, in Universal Serial Bus cables, there are four wires grouped together that run through each USB cable. This is a bundle of cables that are grouped together by their outer coating. Similarly, there can be multiple cables or other materials that will be wrapped by the pressure or capacitive sensing technology.

In an embodiment, the exterior surface of the core is conductive.

Description of Buffer Layer

Buffer layer is used in order to create a gap between the two conductive layers. The gap can be created by placing a non-conductive material between the two conductive layers. This may be a foam, plastic or rubber that will help keep the cable flexible.

Outermost Covering (Tubing):

To protect users from electric shock or injury as well as protect the technology within the cable, the use of tubing may be necessary. This tubing can include a variety of different materials. However, for best possible results, materials that are flexible and provide protection from stress and other external forces would be the best type of outer-casing—rubber, plastic or any material with similar conductive properties that will keep cable's flexibility, without interfering with the capacitance.

In an embodiment, the outer casing may include interlocking circular links that will allow the cable to be flexible. It can also be a type of tape spirally-wound over the cable to protect it from external disturbances.

Description of MCU

The MCU, or microcontroller, is responsible for handling the sensory data generated through the capacitive or pressure sensing. In the case of the capacitive circuit, the MCU may perform multiple tasks. First, it may control the charging and discharging of the capacitor or capacitors. A single pin may be devoted to this task. In addition, the MCU may also measure the capacitance of this pin and convert the measurement into a digital reading. When a hand or skin touches the surface of the cable, this digital capacitance will change. The MCU detects this change in the digital reading and determines if the change is sufficient enough to be considered a positive trigger. When a positive trigger is sensed, the MCU raises the voltage of an output pin to high.

This pin is connected to a transistor that is placed between to the power source and the lighting system. High voltages on this pin allows current to flow between the power source and the lighting system. In the case where the MCU is used in a pressure sense system, the input pins may be used to measure the current running through the conductive foam. By monitoring these inputs, it enables the MCU to determine when a sufficient change between currents has occurred and then raises an output pin to a high voltage. This pin serves the same purpose as in the capacitive sensing case.

Lighting System

The cable can be lit by using various devices. In one embodiment, LEDs are used. The LEDs will obtain power from the battery or draw power from within the cable itself and be connected in one circuit so that all the LEDs will turn on at once. The number and size of the LEDs may vary.

In another embodiment, the light-emitting source is electroluminescent wire. This lighting technique requires obtaining power from the battery, and converting it into a frequency that when sent through the phosphorus coating, will cause the wire to illuminate.

The invention claimed is:

1. A cable sensing device comprising:
a central flexible shaft having an outer layer and an inner layer;
at least one sensor, one placed outside of the outer layer of the central flexible shaft and another placed on the inside of the outer layer, wherein the two sensors are either capacitive or pressure sensing,
said sensor, disposed on the outer layer of the flexible shaft, comprising a first capacitive sensor, a second capacitive sensor and a dielectric element disposed between the first capacitive sensor and the second capacitive sensor, wherein a change in capacitance detected by a microcontroller when a human body comes close or in contact with one of the at least two sensors causes at least one of a plurality of lighting sources to be illuminated if the detected change in capacitance is above a predetermined level.

2. The cable sensing device of claim 1, wherein the outer layer and the inner layer are substantially cylindrical in shape.

3. The cable sensing device of claim 1, wherein the at least one capacitor and the plurality of lighting sources are disposed along the length of the cable sensing device.

4. The cable sensing device of claim 1, wherein the at least one capacitor and the plurality of lighting sources are disposed along the circumference of the cable sensing device.

5. The cable sensing device of claim 1, wherein the at least one capacitor and the plurality of lighting sources are disposed spirally along the length of the cable sensing device.

6. The cable sensing device of claim 1, wherein the outer layer comprises a rigid series of interlocking pieces.

7. A method of sensing comprising:
charging at least one capacitor disposed on a outer surface of a central flexible shaft;
detecting, by a microcontroller, a change in capacitance when a human body comes close or in contact with the at least one capacitor;
sending, by a microcontroller, a power signal to at least one of a plurality of lighting sources when the detected change in capacitance is above a predetermined level; and
illuminating at least one of the plurality of lighting sources when the power signal is received.

8. A cable sensing device comprising:
at least one pair of conductive sensors, the at least one pair of conductive sensors comprising a first conductive sensor and a second conductive sensor disposed on opposite sides of a circumference of the cable sensing device, wherein the first conductive sensor is configured to receive a low voltage stock; and
a plurality of lighting sources;
wherein a change in resistance detected by a microcontroller when a human body comes in contact with the cable sensing device causes at least one of the plurality of lighting sources to be illuminated if the detected change in resistance is above a predetermined level.

9. The cable sensing device of claim 8, wherein the microcontroller comprises multiple comparator circuits.

10. The cable sensing device of claim 8, wherein the first conductive sensor and the second conductive sensor are conductive foams.

11. A cable sensing device comprising:
at least one pair of conductive sensors, the at least one pair of conductive sensors comprising a first conductive sensor and a second conductive sensor disposed on opposite sides of a circumference of the cable sensing device;
a plurality of lighting sources; and
a microcontroller configured to supply a low stock voltage to the first conductive sensor, detect a change in resistance of the at least one pair of conductive sensors when a human body comes in contact with the cable sensing device and send a power signal to illuminate at least one of the plurality of lighting sources if the detected change in resistance is above a predetermined level.

12. A method of sensing comprising:
supplying, by a microcontroller, a low stock voltage to at least one pair of conductive sensors, the at least one pair of conductive sensors comprising a first conductive sensor and a second conductive sensor disposed on opposite sides of a circumference of a flexible cable;
detecting, by a microcontroller, a change in resistance when a human body comes in contact with the flexible cable;
sending, by a microcontroller, a power signal to at least one of a plurality of lighting sources when the detected change in resistance is above a predetermined level; and
illuminating at least one of the plurality of lighting sources when the power signal is received.

* * * * *